(12) United States Patent
Bae et al.

(10) Patent No.: US 11,852,930 B2
(45) Date of Patent: Dec. 26, 2023

(54) DISPLAY DEVICE

(71) Applicant: Samsung Display Co., Ltd., Yongin-Si (KR)

(72) Inventors: Jin Hee Bae, Asan-si (KR); Min Ho Kim, Asan-si (KR); Kyung Ha Moon, Seoul (KR); Bum Suk Lee, Asan-si (KR); Nak Sung Choi, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 198 days.

(21) Appl. No.: 16/903,449

(22) Filed: Jun. 17, 2020

(65) Prior Publication Data
US 2020/0400992 A1 Dec. 24, 2020

(30) Foreign Application Priority Data
Jun. 21, 2019 (KR) ........................ 10-2019-0074263

(51) Int. Cl.
| | |
|---|---|
| *G02F 1/1345* | (2006.01) |
| *G09G 3/36* | (2006.01) |
| *G02F 1/1333* | (2006.01) |
| *H05K 1/18* | (2006.01) |
| *H05K 1/11* | (2006.01) |

(52) U.S. Cl.
CPC ...... *G02F 1/13452* (2013.01); *G02F 1/13458* (2013.01); *G02F 1/133345* (2013.01); *G09G 3/3696* (2013.01); *H05K 1/118* (2013.01); *H05K 1/189* (2013.01); *G09G 2300/0426* (2013.01); *G09G 2300/0478* (2013.01); *G09G 2310/0278* (2013.01); *H05K 2201/09236* (2013.01); *H05K 2201/10128* (2013.01); *H05K 2201/10136* (2013.01)

(58) Field of Classification Search
None
See application file for complete search history.

(56) References Cited

U.S. PATENT DOCUMENTS

| | | | |
|---|---|---|---|
| 9,135,390 B2 * | 9/2015 | Jang ...................... | G06F 30/398 |
| 10,624,207 B2 * | 4/2020 | Aisaka .................. | H05K 3/323 |
| 10,706,753 B2 * | 7/2020 | Lee ...................... | G02F 1/13452 |
| 2006/0232292 A1 * | 10/2006 | Shimizume ........ | G01R 31/2812 |
| | | | 324/762.02 |

(Continued)

FOREIGN PATENT DOCUMENTS

| | | |
|---|---|---|
| JP | H11-142871 A | 5/1999 |
| KR | 10-2009-0054817 A | 6/2009 |

(Continued)

*Primary Examiner* — Fred Tzeng
(74) *Attorney, Agent, or Firm* — Innovation Counsel LLP

(57) ABSTRACT

A display device is provided. A display device includes a display panel including a plurality of connecting signal wires which supply different control voltages; a flexible printed circuit board attached to a side surface of the display panel and including a base film and a plurality of lead wires which are disposed on the base film; an anisotropic conductive film disposed between the plurality of connecting signal wires and the plurality of lead wires, and at least one bump wire disposed between adjacent connecting signal wires, the at least one bump wire being not supplied with the different control voltages controlling the display panel.

20 Claims, 14 Drawing Sheets

(56) References Cited

U.S. PATENT DOCUMENTS

| | | | | |
|---|---|---|---|---|
| 2007/0138653 A1* | 6/2007 | Bartley | ............... | H05K 1/141 |
| | | | | 257/E23.079 |
| 2008/0165483 A1* | 7/2008 | Tanaka | ............... | H01L 24/17 |
| | | | | 361/679.01 |
| 2012/0320542 A1* | 12/2012 | Jeong | ............... | H05K 3/323 |
| | | | | 156/60 |
| 2017/0052639 A1* | 2/2017 | Kobayashi | ............ | G06F 3/0446 |
| 2019/0103455 A1* | 4/2019 | Song | ............... | H01L 27/3279 |
| 2020/0161337 A1* | 5/2020 | Song | ............... | G02F 1/13458 |
| 2020/0194893 A1* | 6/2020 | Im | ............... | H01L 23/5386 |
| 2020/0292864 A1* | 9/2020 | Kim | ............... | H05K 1/147 |
| 2020/0356217 A1* | 11/2020 | Jeong | ............... | G06F 3/0447 |
| 2020/0393937 A1* | 12/2020 | Kim | ............... | H01L 27/3276 |
| 2020/0395546 A1* | 12/2020 | Song | ............... | H01L 51/56 |
| 2021/0248950 A1* | 8/2021 | Jin | ............... | G09G 3/20 |

FOREIGN PATENT DOCUMENTS

| | | |
|---|---|---|
| KR | 10-2013-0117103 A | 10/2013 |
| KR | 10-2014-0115044 A | 9/2014 |
| KR | 10-2014-0115045 A | 9/2014 |
| KR | 10-2015-0072743 A | 6/2015 |

* cited by examiner

DISPLAY DEVICE

This application claims priority to Korean Patent Application No. 10-2019-0074263, filed on Jun. 21, 2019, and all the benefits accruing therefrom under 35 U.S.C. § 119, the disclosure of which is incorporated herein by reference in its entirety.

BACKGROUND

1. Field of the Disclosure

The present disclosure relates to a display device.

2. Description of the Related Art

Display devices have increasingly become of great importance with the development of multimedia. Accordingly, various display devices such as a liquid crystal display (LCD) device, an organic light-emitting diode (OLED) display device, or the like have been developed and used.

The LCD device, which is one of the most widely used flat panel display devices, includes two substrates where field-generating electrodes such as pixel electrodes and a common electrode are formed and a liquid crystal layer which is disposed between the two substrates. The LCD device generates an electric field in the liquid crystal layer by applying voltages to the field-generating electrodes, and thereby displays an image by determining the orientation of liquid crystal molecules in the liquid crystal layer and controlling the polarization of incident light.

Meanwhile, a printed circuit board (PCB) including a plurality of signal wires for driving a display device and a plurality of lead wires connected to the signal wires is needed to display images in the display device. The display device includes a display area in which an image is displayed and a bezel area which surrounds the display area and in which no image is displayed. In order to implement a bezel-less display device, the signal wires and the lead wires may be disposed on a side of the display device.

SUMMARY

Aspects of the present disclosure provide a display device capable of reducing the corrosion of wires using bump wires.

It should be noted that objects of the present disclosure are not limited to the above-described objects, and other objects of the present disclosure will be apparent to those skilled in the art from the following descriptions.

An embodiment of a display device includes a display panel including a plurality of connecting signal wires which supply different control voltages controlling the display panel, the display panel including a top surface through which an image is displayed, a bottom surface opposing the top surface and a side surface connecting the top surface and the bottom surface; a flexible printed circuit board attached to the side surface of the display panel and including a base film and a plurality of lead wires which are disposed on the base film; an anisotropic conductive film disposed between the plurality of connecting signal wires and the plurality of lead wires, and at least one bump wire disposed between adjacent connecting signal wires, the at least one bump wire being not supplied with the different control voltages controlling the display panel.

According to an embodiment of the present disclosure, the corrosion of wires can be reduced using bump wires.

Effects according to the present disclosure are not limited by the above-described examples, and more various effects are included in the present disclosure.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION OF THE EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The same reference numbers indicate the same components throughout the specification.

Hereinafter, exemplary embodiments of the present disclosure will be described with reference to the accompanying drawings.

Figure 1:
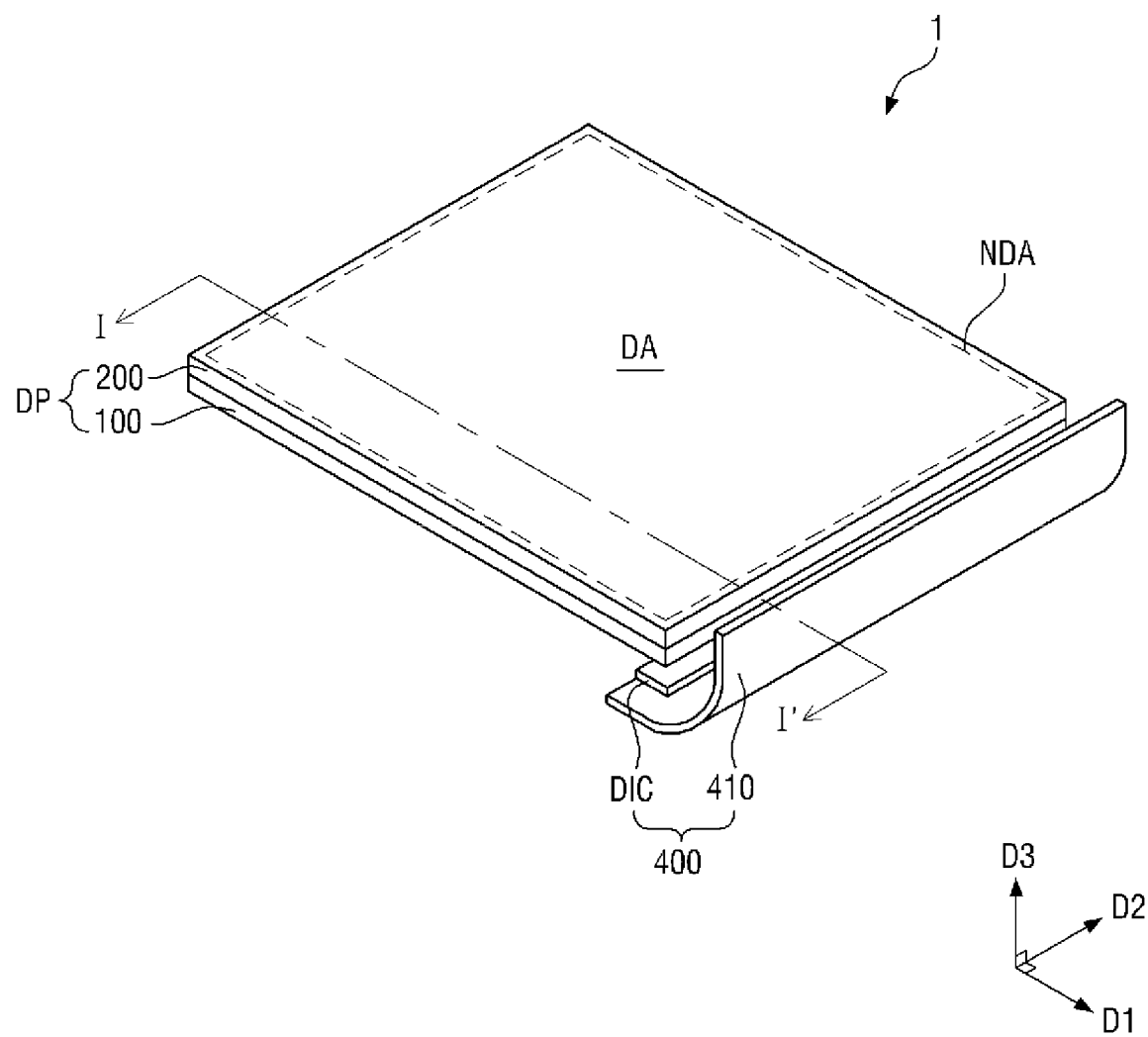
FIG. 1 is a perspective view of a display device according to an embodiment of the present disclosure.

FIG. 1 is a perspective view of a display device according to an embodiment of the present disclosure.

Referring to FIG. 1, a display device 1 may include a display panel DP and a flexible printed circuit board (FPCB) 400 which is attached to a side of the display panel DP. The display panel DP may include a lower substrate 100 and an upper substrate 200. The FPCB 400 may include a base film 410 and a driving circuit DIC which is disposed on the base film 410.

An image may be displayed in a display area DA which is provided on the upper substrate 200 of the display panel DP. The display panel DP may display an image on a plane defined by a first direction D1 and a second direction D2 which is perpendicular to the first direction D1, in the display area DA. No image is displayed in a peripheral area NDA which surrounds the display area DA. That is, the peripheral area NDA may correspond to the bezel of the display device 1.

The FPCB 400 may be attached onto the side of the display panel DP. That is, the FPCB 400 may be attached onto sides of the lower and upper substrates 100 and 200, and as a result, a display device 1 with a minimized bezel can be implemented. The FPCB 400 may extend in a third direction D3 which is perpendicular to the first and second directions D1 and D2, may be bent toward the rear of the display panel DP so that the driving circuit DIC may overlap with the upper and lower substrates 100 and 200 in a plan view.

The driving circuit DIC may generate signals for driving the display panel DP. The driving circuit DIC may be electrically connected to the display panel DP via conductive patterns 420 of FIG. 6. For example, the driving circuit DIC may be an integrated circuit (IC) mounted on the base film 410.

Figure 2:
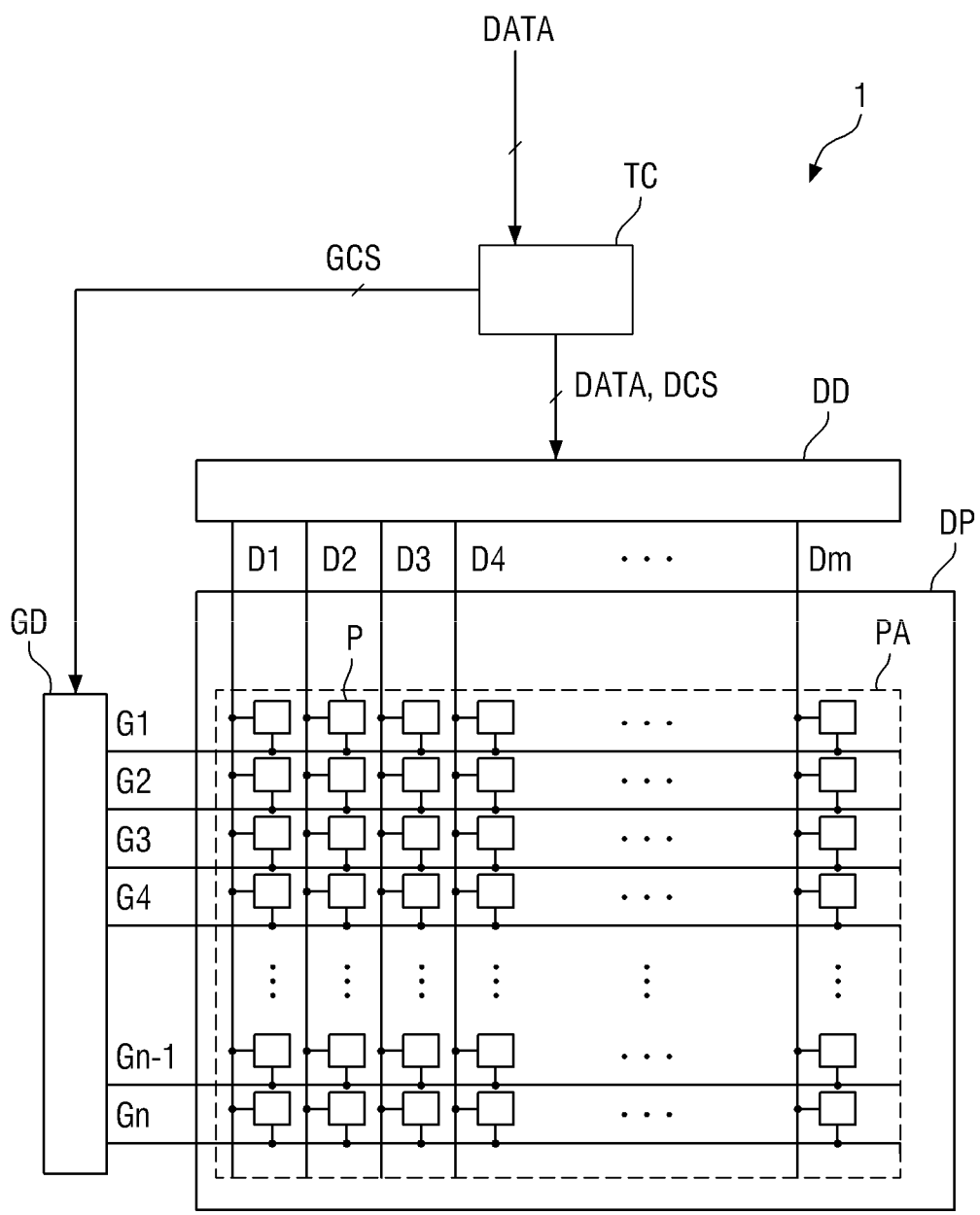
FIG. 2 is a block diagram of the display device of FIG. 1.
Figure 3:
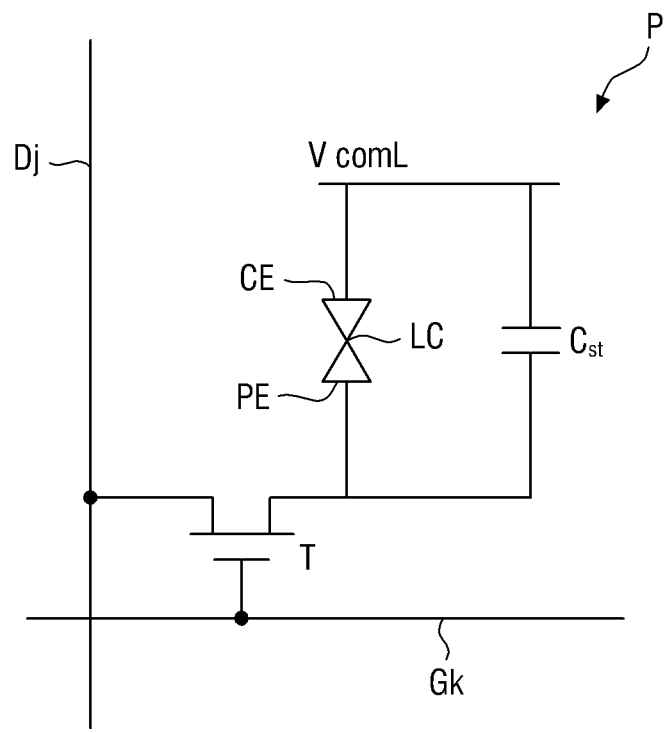
FIG. 3 is a circuit diagram of an exemplary pixel of the display device of FIG. 1.
Figure 4:
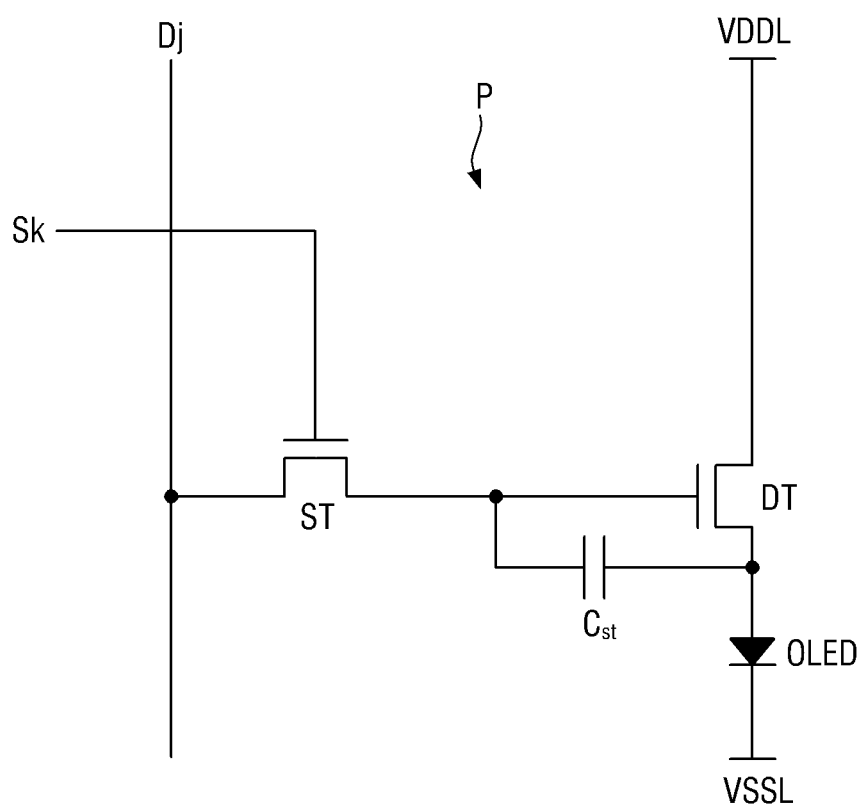
FIG. 4 is a circuit diagram of another exemplary pixel of the display device of FIG. 1.

FIG. 2 is a block diagram of the display device 1. FIG. 3 is a circuit diagram of an exemplary pixel of the display device 1. FIG. 4 is a circuit diagram of another exemplary pixel of the display device 1.

Referring to FIG. 2, the display device 1 includes the display panel DP, a gate driver GD, a data driver DD, and a timing controller TC.

The display device 1 may be any type of display device capable of providing data voltages to pixels in a line-sequential scanning manner by sequentially applying gate signals to a plurality of first through n-th gate lines G1 through Gn (where n is a positive integer of 2 or greater). For example, the display device 1 may be implemented as one of a liquid crystal display (LCD) device, an organic light-emitting diode (OLED) display device, a field-emission display (FED) device, and an electrophoretic display device.

The display panel DP may include an upper substrate and a lower substrate. A plurality of first through m-th data lines D1 through Dm (where m is a positive integer of 2 or greater), the first through n-th gate lines G1 through Gn, and a pixel array PA including pixels P may be formed on the lower substrate. Each of the pixels P may be connected to one of the first through m-th data lines D1 through Dm and one of the first through n-th gate lines G1 through Gn. As a result, the pixels P may receive data voltages from the first through m-th data lines D1 through Dm in response to gate signals being applied to the first through n-th gate lines G1 through Gn, and may emit light at a predetermined brightness in accordance with the data voltages.

In a case where the display device 1 is implemented as an LCD device, each of the pixels P may include a transistor T, a pixel electrode PE, and a storage capacitor Cst, as illustrated in FIG. 3. The transistor T may provide a data voltage from a data line Dj (where j is a positive integer that satisfies $1 \leq j \leq m$) to the pixel electrode PE in response to a gate signal from a gate line Gk (where k is a positive integer that satisfies $1 \leq k \leq n$). Accordingly, each of the pixels P can drive the liquid crystal molecules in a liquid crystal layer LC with an electric field generated due to the difference between the data voltage provided to the pixel electrode PE and a common voltage provided to a common electrode CE, and can thus control the amount of light passes through the liquid crystal layer among light incident from a backlight unit. The common electrode CE receives the common voltage from a common voltage line VcomL, and the backlight unit is disposed below the display panel DP and applies light uniformly to the display panel DP. The storage capacitor Cst is provided between the pixel electrode PE and the common electrode CE to uniformly maintain the voltage difference between the pixel electrode PE and the common electrode CE.

In a case where the display device 1 is implemented as an OLED display device, each of the pixels P may include an OLED "OLED", a scan transistor ST, a driving transistor DT, and a storage capacitor Cst. The scan transistor ST may provide a data voltage from the j-th data line Dj to the gate electrode of the driving transistor DT. The driving transistor DT controls a driving current that flows from a high-potential voltage line VDDL to the OLED "OLED" in accordance with the data voltage provided to the gate electrode thereof. The OLED "OLED" is provided between the driving transistor DT and a low-potential voltage line VSSL to emit light at a predetermined brightness in accordance with the driving current. The storage capacitor Cst may be provided between the gate electrode of the driving transistor DT and the high-potential voltage line VDDL to uniformly maintain the voltage at the gate electrode of the driving transistor DT.

Figure 5:
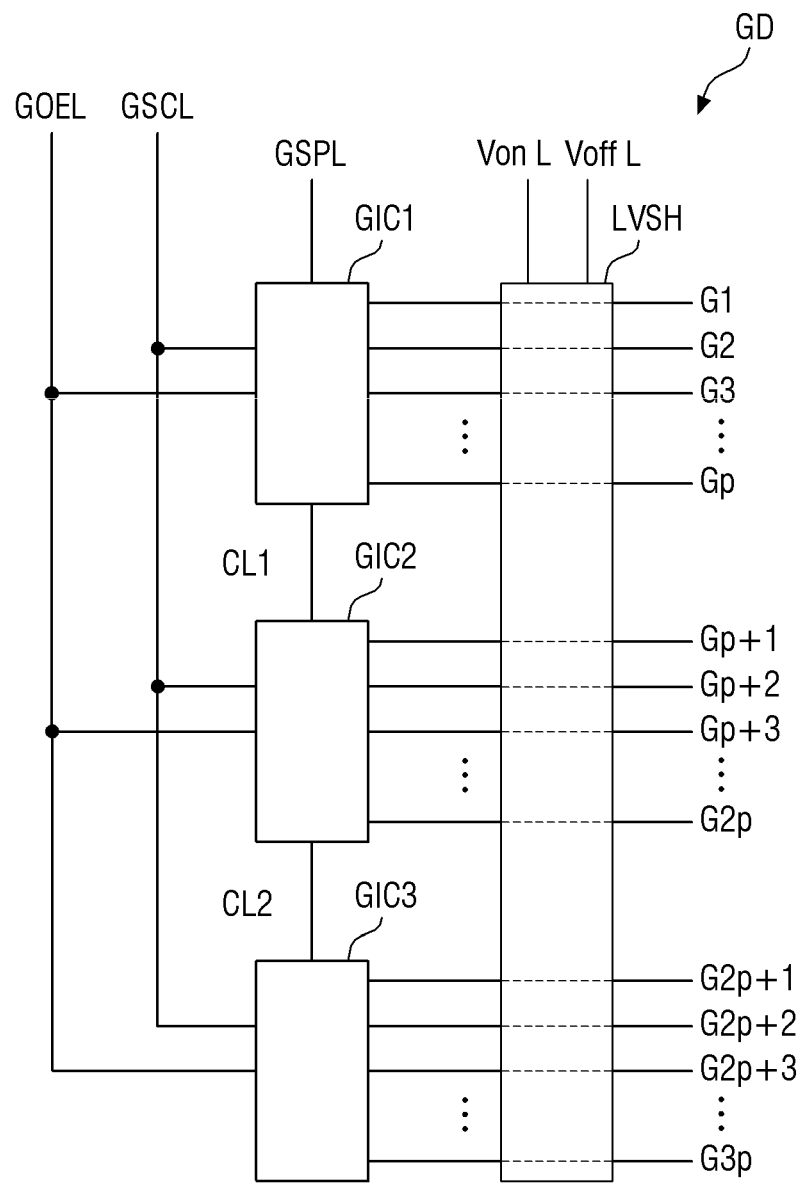
FIG. 5 is a block diagram illustrating gate driver integrated circuits (ICs) of FIG. 2.

Referring to FIG. 5, the gate driver GD may include a plurality of first, second, and third gate driver ICs GIC1, GIC2, and GIC3. The first, second, and third gate driver ICs GIC1, GIC2, and GIC3 are connected to the first through 3p-th gate lines G1 through G3p. The first, second, and third gate driver ICs GIC1, GIC2, and GIC3 receive gate control signals GCS from the timing controller TC through a gate shift clock line GSCL and a gate output enable signal line GOEL, generate gate signals in accordance with the gate control signals GCS, and provide the gate signals to the first through 3p-th gate lines G1 through G3p.

The data driver DD may include a plurality of source driver ICs SIC. The source driver ICs SIC receive digital video data DATA and data control signals DCS from the timing controller TC and convert the digital video data DATA into analog data voltages in accordance with the data control signals DCS. The source driver ICs SIC provide the data voltages to the first through m-th data lines D1 through Dm.

The timing controller TC receives the digital video data DATA and timing signals from an external system board (not illustrated). The timing signals may include a vertical synchronization signal, a horizontal synchronization signal, a data enable signal, and a dot clock. The timing controller TC generates the gate control signals GCS which controls the operation timing of the gate driver GD, and the data control signals DCS which controls the operation timing of the data driver DD.

The gate control signals GCS include a gate start signal GSP, a gate shift clock GSC, a gate output enable signal GOE, and a selection signal SEL. The gate start signal GSP is a signal for controlling the output timing of a first gate pulse in a first frame period. The gate shift clock GSC is a clock signal for shifting the gate start signal GSP. The gate output enable signal GOE is a signal for controlling the output width of each gate signal. The selection signal SEL is a signal for controlling the output of start feedback signals and carry signals of the first, second, and third gate driver ICs GIC1, GIC2, and GIC3.

The source timing control signals DCS include a source start signal, a source sampling clock, a source output enable signal, and a polarity control signal. The source start signal is a signal for controlling the start time of a data sampling operation of the data driver DD. The source sampling clock is a clock signal for controlling a sampling operation of the data driver DD in accordance with rising or falling edges. The polarity control signal is a signal for inverting the polarity of the data voltages output by the data driver DD at intervals of L horizontal periods (where L is a natural number). The source output enable signal is a signal for controlling the output of the data driver DD.

The timing controller TC provides the digital video data DATA and the source control signals DCS to the data driver DD. The timing controller TC provides the gate control signals GCS to the gate driver GD.

The first, second, and third gate driver ICs GIC1, GIC2, and GIC3 may be implemented as driving chips. The first, second, and third gate driver ICs GIC1, GIC2, and GIC3 may be mounted on gate flexible films. The gate flexible films may be implemented as tape carrier packages or chip-on-films (COFs). Each of the COFs may include a base film and a plurality of conductive lead wires which are provided on the base film. The gate flexible films may be bent or curved. The gate flexible films may be attached onto the lower substrate 100 through tape automated bonding (TAB) using an anisotropic conductive film (ACF), and as a result, the first, second, and third gate driver ICs GIC1, GIC2, and GIC3 may be connected to the first through $3p$-th gate lines G1 through $3p$.

The source driver ICs SIC may be implemented as driving chips. The source driver ICs SIC may be mounted on source flexible films. The source flexible films may be implemented as tape carrier packages or COFs. The source flexible films may be bent or curved. The source flexible films may be attached onto the lower substrate 100 through TAB using an ACF, and as a result, the source driver ICs SIC may be connected to the first through m-th data lines D1 through Dm.

Although not specifically illustrated, the source flexible films may be attached on a source printed circuit board (PCB). The source PCB may be implemented as an FPCB that can be bent or curved.

The timing controller TC is mounted on a control PCB. The control PCB and the source PCB may be connected via an FPCB such as a flexible flat cable or a flexible printed circuit (FPC). The control PCB may not be provided, in which case, the timing controller TC may be mounted on the source PCB.

FIG. 5 is a block diagram illustrating the gate driver ICs of FIG. 2.

FIG. 5 illustrates that the display device 1 includes three gate driver ICs, i.e., the first, second, and third gate driver ICs GIC1, GIC2, and GIC3, but the present disclosure is not limited thereto. That is, the display device 1 may include s gate driver ICs (where s is a positive integer of 2 or greater) connected thereto dependently.

Referring to FIG. 5, the first gate driver IC GIC1 is connected to a gate start signal line GSPL, a gate shift clock line GSCL, and a gate output enable signal line GOEL. Also, the first gate driver IC GIC1 is connected to first through p-th gate lines G1 through Gp (where p is a positive integer of 2 or greater). The first gate driver IC GIC1 is connected to a first carry signal line CL1.

The first gate driver IC GIC1 generates first through p-th gate signals which are to be sequentially output in accordance with the gate start signal GSP, which is input via the gate start signal line GSPL, the gate shift clock GSC, which is input via the gate shift clock line GSCL, and the gate output enable signal GOE, which is input via the gate output enable signal line GOEL. The first gate driver IC GIC1 outputs the first through p-th gate signals to the first through p-th gate lines G1 through Gp. The first gate driver IC GIC1 outputs a carry signal to the first carry signal line CL1.

The second gate driver IC GIC2 is connected to the first carry signal line CL1, the gate shift clock line GSCL, and the gate output enable signal line GOEL. Also, the second gate driver IC GIC2 is connected to (p+1)- through $2p$-th gate lines Gp+1 through G$2p$. The second gate driver IC GIC2 is connected to a second carry signal line CL2.

The second gate driver IC GIC2 generates (p+1)- through $2p$-th gate signals which are to be sequentially output in accordance with a previous-stage carry signal, which is input via the first carry signal line CL1, the gate shift clock GSC, which is input via the gate shift clock line GSCL, and the gate output enable signal GOE, which is input via the gate output enable signal line GOEL. Here, the previous-stage carry signal input via the first carry signal line CL1 refers to the carry signal output by the first gate driver IC GIC1. The second gate driver IC GIC2 outputs the (p+1)- through $2p$-th gate signals to the (p+1)- through $2p$-th gate lines Gp+1 through G$2p$. The second gate driver IC GIC2 outputs a carry signal to the second carry signal line CL2.

The third gate driver IC GIC3 is connected to the second carry signal line CL2, the gate shift clock line GSCL, and the gate output enable signal line GOEL. Also, the third gate driver IC GIC3 is connected to ($2p$+1)- through $3p$-th gate lines G$2p$+1 through G$3p$, where $3p$ equals to n in FIG. 2.

The third gate driver IC GIC3 generates ($2p$+1)- through $3p$-th gate signals which are to be sequentially output in accordance with a previous-stage carry signal, which is input via the second carry signal line CL2, the gate shift clock GSC, which is input via the gate shift clock line GSCL, and the gate output enable signal GOE, which is input via the gate output enable signal line GOEL. Here, the previous-stage carry signal input via the second carry signal line CL2 refers to the carry signal output by the second gate driver IC GIC2. The third gate driver IC GIC3 outputs the ($2p$+1)- through $3p$-th gate signals to the ($2p$+1)- through $3p$-th gate lines G$2p$+1 through G$3p$.

Previous-stage gate driver ICs of an r-th gate driver IC (where r is a positive integer that satisfies 2≤r≤s) refer to first through (r−1)-th gate driver ICs. Subsequent-stage gate driver ICs of the r-th gate driver IC (where r is a positive integer that satisfies 2≤r≤s) refer to (r+1)- through s-th gate driver ICs. Thus, a previous-stage carry signal input to the r-th gate driver IC refers to the carry signal output by the (r−1)-th gate driver IC. For example, the previous-stage carry signal input to the second gate driver IC GIC2 via the first carry signal line CL1 refers to the carry signal output by the first gate driver IC GIC1.

As described above, because the first, second, and third gate driver ICs GIC1, GIC2, and GIC3 are dependently connected and sequentially generate outputs, gate signals can be sequentially provided to the first through n-th gate lines G1 through Gn.

A level shifter LVSH is connected to the first, second, and third gate driver ICs GIC1, GIC2, and GIC3 and receives the output signals of the first, second, and third gate driver ICs GIC1, GIC2, and GIC3. Also, the level shifter LVSH is connected to a gate-on voltage line VonL to receive a gate-on voltage Von and is connected to a gate-off voltage line VoffL to receive a gate-off voltage Voff.

The level shifter LVSH changes the swing width of the output signals of the first, second, and third gate driver ICs GIC1, GIC2, and GIC3 to a swing width at which the transistors provided in the display panel DP can operate. That is, the level shifter LVSH may change the swing width of the output signals of the first, second, and third gate driver ICs GIC1, GIC2, and GIC3 to a swing width from the gate-off voltage to the gate-on voltage Von. The gate-on voltage Von corresponds to a turn-on voltage capable of turning on the transistors provided in the display panel DP, and the gate-off voltage Voff corresponds to a turn-off voltage capable of turning off the transistors provided in the display panel DP. In a case where the transistors provided in the display panel DP are N-type metal oxide semiconductor field effect transistors (MOSFETs), as illustrated in FIGS. 3 and 4, the gate-on voltage Von may be set to a gate-high voltage VGH, and the gate-off voltage Voff may be set to a gate-low voltage VGL which is lower than the gate-high voltage VGH.

Figure 6:
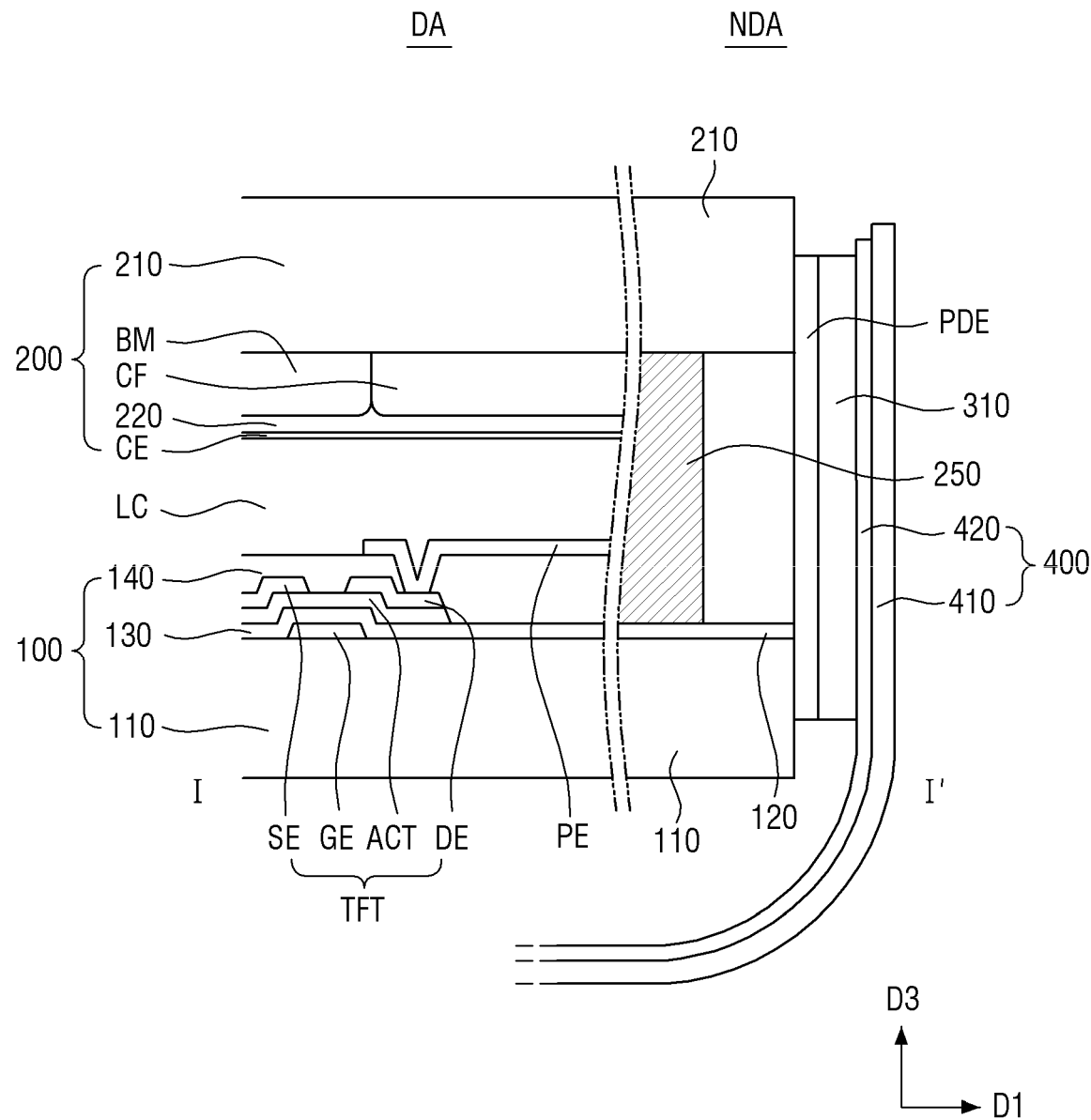
FIG. 6 is a cross-sectional view taken along line I-I' of FIG. 1.
Figure 7:
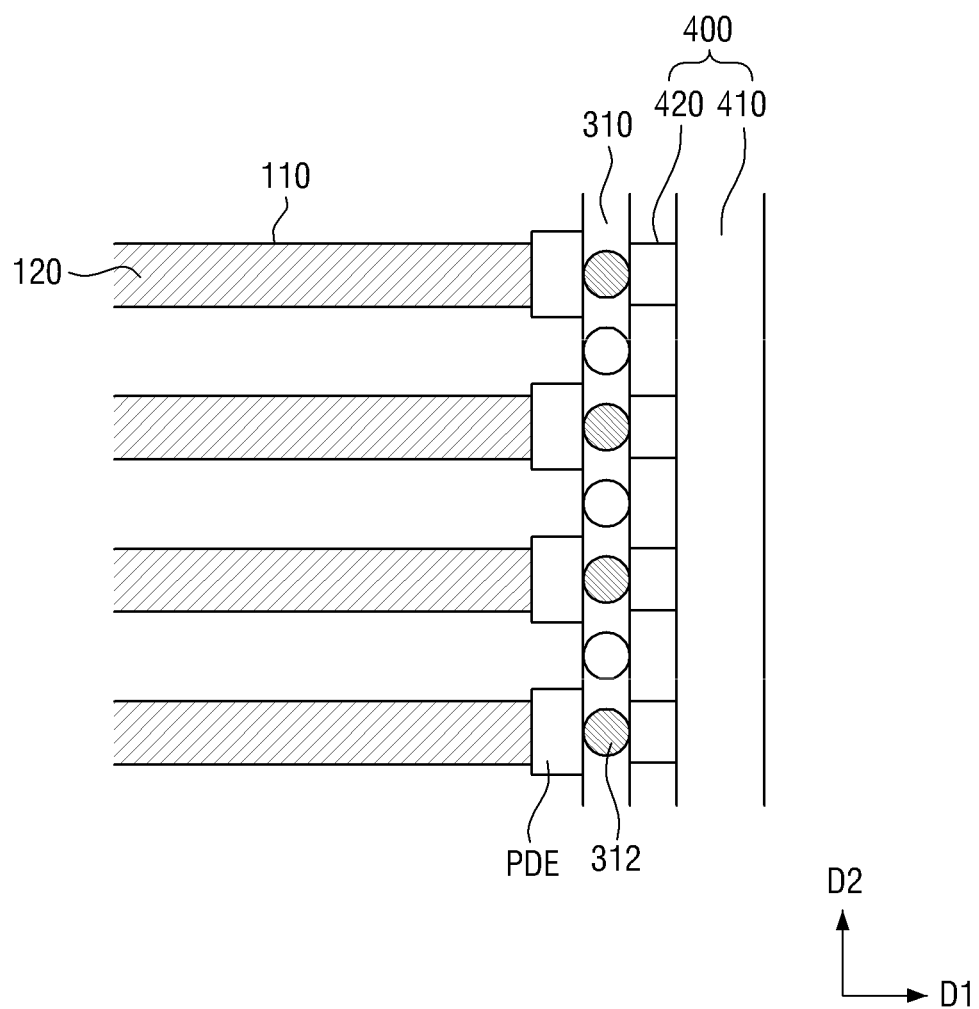
FIG. 7 is a partial enlarged cross-sectional view illustrating part of the display device of FIG. 1 where a flexible printed circuit board (FPCB) and a display panel are bonded.
Figure 8:
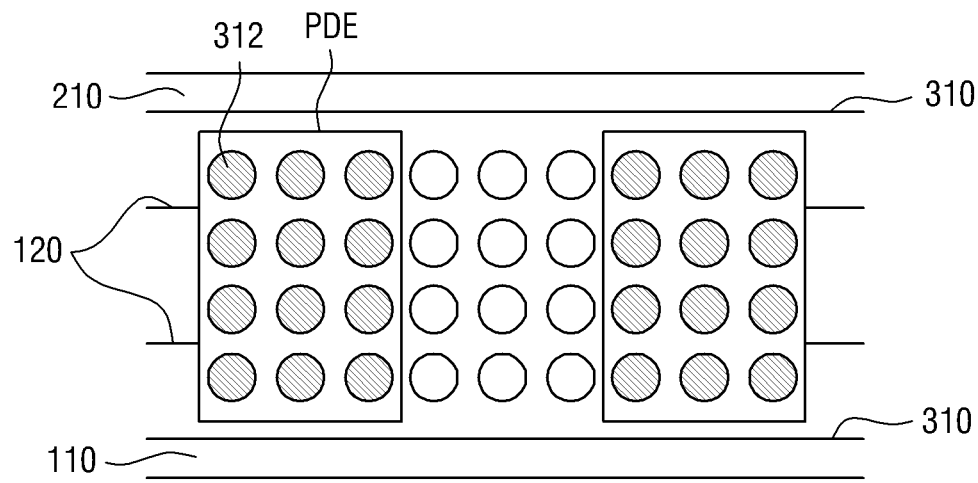
FIG. 8 is a side view illustrating a conductive paste portion of the display device of FIG. 1.
Figure 8:
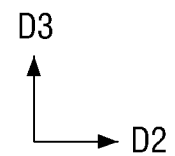

FIG. 6 is a cross-sectional view taken along line I-I' of FIG. 1. FIG. 7 is a partial enlarged cross-sectional view illustrating part of the display device of FIG. 1 where the FPCB and the display panel are bonded. FIG. 8 is a side view illustrating a conductive paste portion of the display device of FIG. 1.

Referring to FIGS. 1 and 6 through 8, the display device 1 may include the lower substrate 100, the upper substrate 200, and the liquid crystal layer LC which is disposed between the lower substrate 100 and the upper substrate 200. The lower substrate 100 may include, in the display area DA, a lower base substrate 110, gate patterns, a first insulating layer 130, an active pattern ACT, data patterns, a second insulating layer 140, and a pixel electrode PE. The upper substrate 200, in the display area DA, may include an upper base substrate 210, a black matrix BM, a color filter CF, an overcoat layer 220, and a common electrode CE.

The lower base substrate 110 may include a transparent insulating substrate. For example, the lower base substrate 110 may be a glass substrate, a quartz substrate, or a transparent resin substrate. In this example, the transparent resin substrate may include a polyimide-based resin, an acrylic-based resin, a polyacrylate-based resin, a polycarbonate-based resin, a polyether-based resin, a sulfonic acid-based resin, or a polyethylene terephthalate (PET)-based resin.

The gate patterns may be disposed on the lower base substrate 110. The gate patterns may be formed using a metal, an alloy, metal oxide, conductive metal oxide, or a transparent conductive material. The gate patterns may include a gate electrode GE, connecting portions 120, and a plurality of signal wires for driving the display device 1.

The first insulating layer 130 may be disposed on the lower base substrate 110 where the gate patterns are formed. The first insulating layer 130 may include an inorganic insulating material. For example, the first insulating layer 130 insulate the gate patterns and may be formed using silicon oxide or metal oxide.

The active pattern ACT may be disposed on the first insulating layer 130. The active pattern ACT may include a semiconductor layer which is formed of amorphous silicon (a-Si:H) and an ohmic contact layer which is formed of n+ amorphous silicon (n+ a-Si:H).

Also, the active pattern ACT may include an oxide semiconductor. For example, the oxide semiconductor may be formed of amorphous oxide including at least one of indium (In), zinc (Zn), gallium (Ga), tin (Sn), and hafnium (Hf). The active pattern ACT may include source and drain regions which are doped with impurities, and may further include a channel region which is provided between the source and drain regions.

The data patterns may be disposed on the active pattern ACT and on the first insulating layer 130. The data patterns may be formed using a metal, an alloy, metal nitride, conductive metal oxide, or a transparent conductive material. The data patterns may include a source electrode SE, a drain electrode DE, and the signa wires for driving the display device 1.

The gate electrode GE, the active pattern ACT, the source electrode SE, and the drain electrode DE may form a thin-film transistor (TFT).

The second insulating layer 140 may be disposed on the active pattern ACT, on the data patterns, and on the first insulating layer 130. The second insulating layer 140 may include an inorganic insulating material or an organic insulating material. For example, the second insulating layer 140 may include photoresist, an acrylic-based resin, a polyimide-based resin, a polyamide-based resin, or a siloxane-based resin.

For example, the second insulating layer 140 may sufficiently cover the active pattern ACT and the data patterns and may have a substantially flat top surface. In another example, the second insulating layer 140 may be formed on the first insulating layer 130 where the active pattern ACT and the data patterns are disposed, to have a substantially uniform thickness.

The pixel electrode PE may be disposed on the second insulating layer 140. The pixel electrode PE may be electrically connected to the drain electrode DE of the TFT via a contact hole that is formed in the second insulating layer 140. The pixel electrode PE may include a transparent conductive material. For example, the pixel electrode PE may include indium tin oxide (ITO) or indium zinc oxide (IZO).

The upper base substrate 210 may be disposed to face the lower base substrate 110. The upper base substrate 210 may include a transparent insulating substrate. For example, the upper base substrate 210 may be a glass substrate, a quartz substrate, or a transparent resin substrate. In this example, the transparent resin substrate may include a polyimide-based resin, an acrylic-based resin, a polyacrylate-based resin, a polycarbonate-based resin, a polyether-based resin, a sulfonic acid-based resin, or a PET-based resin.

The black matrix BM may be disposed on the upper base substrate 210. The black matrix BM may include a material capable of shielding light. The black matrix BM may be disposed to overlap with the TFT.

The color filter CF may be disposed on the upper base substrate 210 where the black matrix BM is disposed. The color filter CF is for providing colors to light that passes through the liquid crystal layer LC. The color filter CF may be a red color filter, a green color filter, and a blue color filter. The color filter CF may be provided to correspond to each pixel, and color filters CF having different colors may be disposed in different adjacent pixels. At the boundary between each pair of adjacent pixels, color filters CF may overlap with each other or may be spaced apart from each other.

The overcoat layer 220 may be disposed on the color filter CF and on the black matrix BM. The overcoat layer 220 planarizes, protects and insulates the color filter CF. The overcoat layer 220 may be formed using an acrylic-based epoxy material.

The common electrode CE may be disposed on the overcoat layer 220. The common electrode CE may be disposed to face the pixel electrode PE. The common electrode CE may include a transparent conductive material. For example, the common electrode CE may include ITO or IZO.

The liquid crystal layer LC may include liquid crystal molecules having optical anisotropy. The liquid crystal molecules are driven by an electric field to block or allow the transmission of light through the liquid crystal layer LC and thus to display an image. The liquid crystal layer LC may be sealed by a sealant 250 which is disposed in the peripheral area NDA between the lower base substrate 110 and the upper base substrate 210.

In the peripheral area NDA, the display device 1 may include the lower base substrate 110, the connecting portions 120 which are disposed on the lower base substrate 110, and the upper base substrate 210.

The connecting portions 120 may include a plurality of signal wires. The signal wires extend along a first direction D1 and are exposed on a side of the display device 1, and the signal wires may be formed to be spaced apart from one another in the second direction D2. That is, the signal wires may be disposed to be spaced apart from one another in a direction in which the side of the display panel DP extends.

Pad electrodes PDE may be physically and electrically connected to the connecting portions 120, respectively. The pad electrodes PDE may include a conductive paste. For example, the conductive paste may include a metal such as silver (Ag). The pad electrodes PDE may be formed to correspond to the respective signal wires of the connecting portions 120. Conductive paste lines may be formed to be spaced apart from one another in the second direction D2. That is, the conductive paste lines may be disposed to be spaced apart from one another in the second direction D2 in which the side of the display panel DP extends.

The pad electrodes PDE may be formed by inkjet-printing the conductive paste directly on the side surface of the display panel DP or by applying the conductive paste on the side surface of the display panel DP and patterning the conductive paste through, for example, laser patterning, but the present disclosure is not limited thereto. That is, the pad electrodes PDE may be formed in various methods other than those set forth herein.

The signal wires may be electrically connected to the driving circuit DIC via the pad electrodes PDE, conductive balls 312 in an ACF 310, and lead wires. A plurality of electrical signals for driving the display device 1 may be applied to the signal wires. The driving circuit DIC may include the gate driver GD, the data driver DD, the timing controller TC, and a power management IC (PMIC).

The pad electrodes PDE, the ACF 310, and the FPCB 400 may be sequentially arranged on sides of the lower base substrate 110 and the upper base substrate 210. The FPCB 400 may include the base film 410 and the conductive patterns 420 which are disposed on the base film 410.

The ACF 310 may include a plurality of conductive balls 312 which are included in a resin film. The conductive balls may be polymer balls coated with a metal such as nickel (Ni) or gold (Au). The resin film may include a thermosetting resin or a thermoplastic resin.

Preferably, the ACF 310 may be a non-random array ACF. For example, the ACF 310 may include a plurality of conductive balls 312 which are arranged in a single layer in a resin film having adhesiveness. The conductive balls 312 may be arranged at regular intervals in a matrix on the plane defined by the second and third directions D2 and D3. The thickness of the resin film of the ACF 310 may preferably be the same as, or smaller than, the diameter of the conductive balls 312. Because the conductive balls 312 are polymer balls coated with a metal, the conductive balls 312 have elasticity. Thus, even if the thickness of the resin film of the ACF 310 is the same as, or smaller than, the diameter of the conductive balls 312, the resin film of the ACF 310 can be attached to the pad electrodes PDE and the conductive patterns 420 of the FPCB 400.

The higher the resolution of the display device 1 is, the more sophisticated the signal wires of the connecting portions 120 become, and the smaller the contact area of the pad electrodes PDE and the ACF 310 becomes. Thus, contact defects may occur. Such contact defects can be prevented if the conductive balls 312 of the ACF 310 are sufficiently small and uniformly arranged and the thickness of the resin film of the ACF 310 is the same as, smaller than, the diameter of the conductive balls 312.

For example, the non-random array ACF may be formed by forming micro-cavities on a film through laser interference lithography, uniformly arranging conductive balls in the micro-cavities, and performing coating or lamination. The non-random array ACF may be fabricated in various well-known manners other than that set forth herein.

The base film 410 of the FPCB 400 may be a flexible film. The conductive patterns 420 of the FPCB 400 may be formed to correspond to the respective pad electrodes PDE on the base film 410.

Problems that may arise when the FPCB 400 is connected to the side of the display panel DP and solutions for the problems will hereinafter be described.

Figure 9:
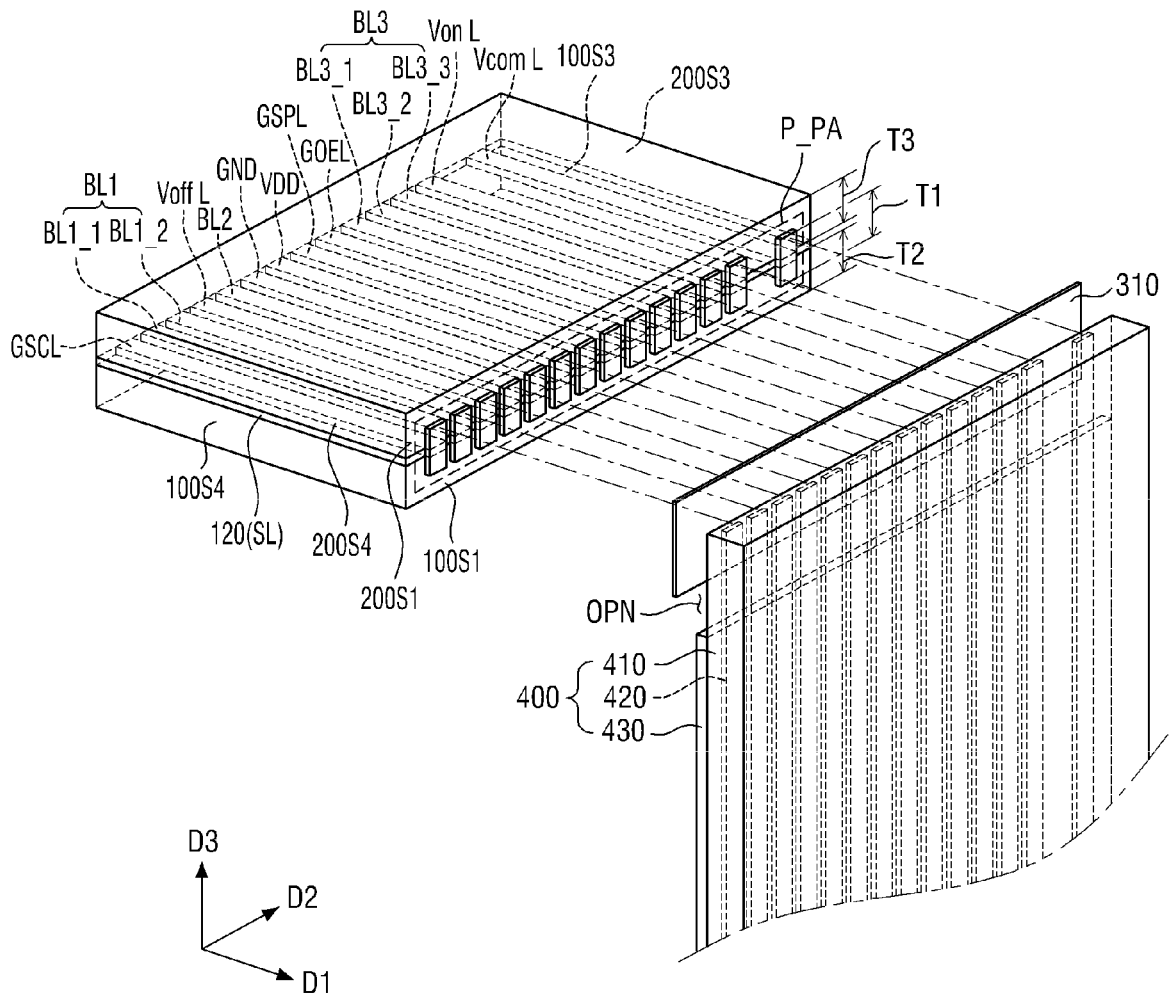
FIG. 9 is an exploded perspective view of the display device of FIG. 1.
Figure 10:
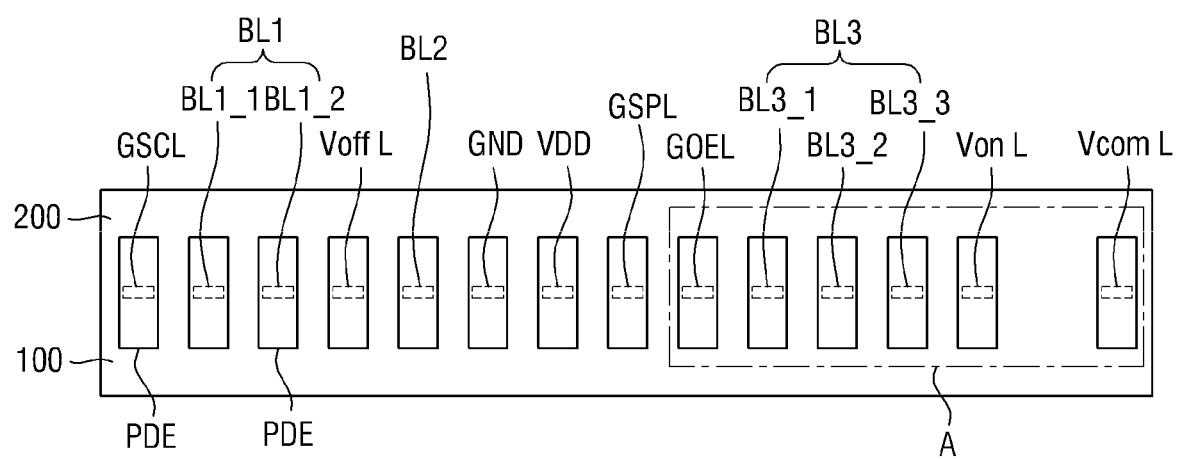
FIG. 10 illustrates a pad portion of FIG. 9.
Figure 11:
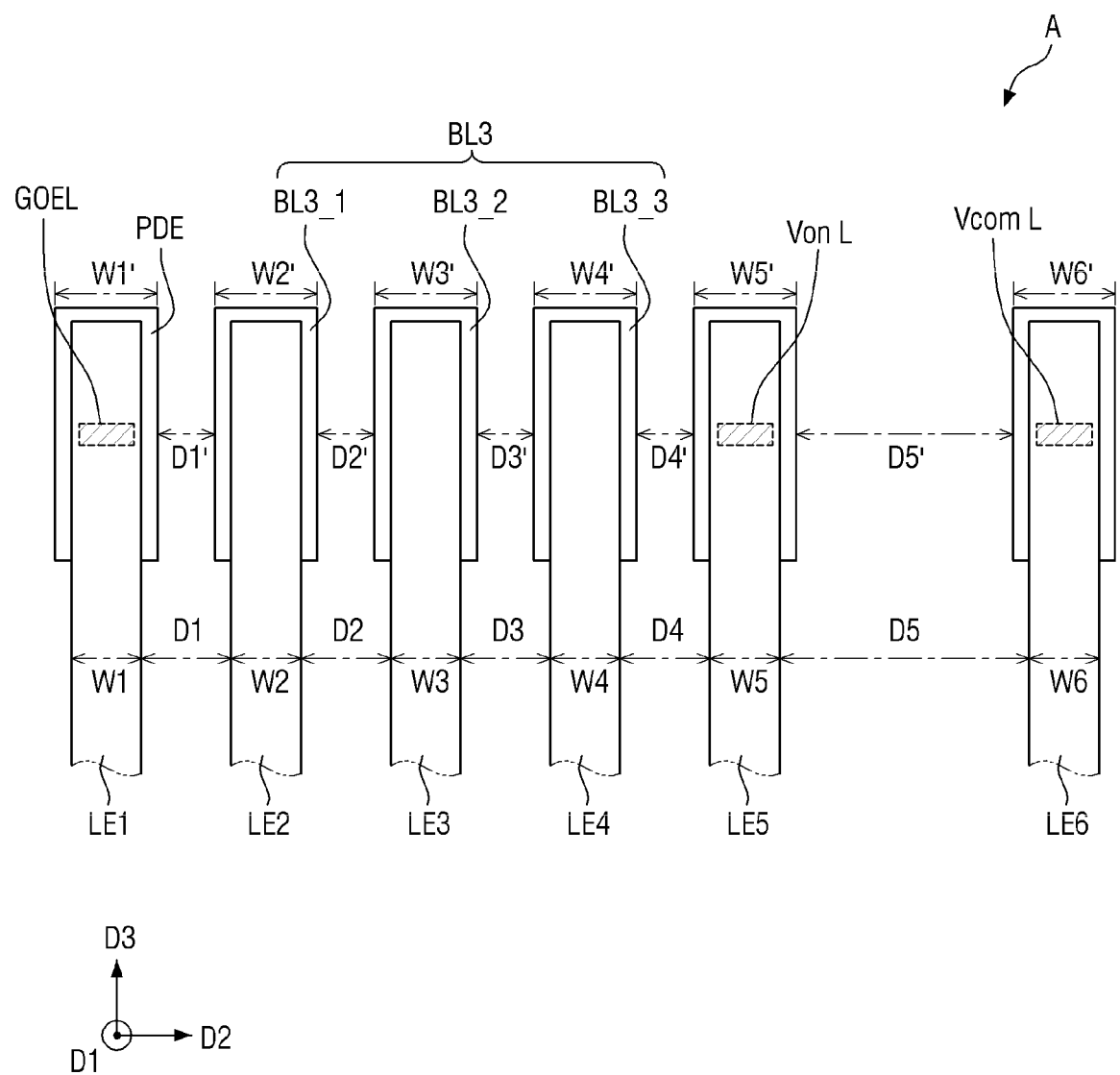
FIG. 11 illustrates the arrangement of connecting signal wires, pad electrodes, and lead wires according to an embodiment of the present disclosure.

FIG. 9 is an exploded perspective view of the display device of FIG. 1. FIG. 10 illustrates a pad portion of FIG. 9. FIG. 11 illustrates the arrangement of connecting signal wires, pad electrodes, and lead wires according to an embodiment of the present disclosure.

Referring to FIGS. 9 through 11, the display panel DP may include the lower substrate 100, the upper substrate 200, which faces the lower substrate 100, the connecting portions 120, which are disposed between the lower and upper substrates 100 and 200, and the pad electrodes PDE and the FPCB 400, which are disposed in the panel pad area P_PA on the sides of the lower and upper substrates 100 and 200.

The connecting portions 120 may include a plurality of connecting signal wires SL which are disposed on the lower substrate 100, as illustrated in FIG. 9. The connecting signal wires SL may be electrically connected to the respective pad electrodes PDE. The connecting signal wires SL may electrically connect pixels PX of the display panel DP. The connecting signal wires SL may be disposed in the panel pad area P_PA and between the pixels PX of the display panel DP. The connecting signal wires SL may include a plurality of transistors T and capacitors Cst connected thereto.

The connecting signal wires SL may be a gate conductive layer which includes the first through n-th gate lines G1 through Gn and/or the gate electrodes of the pixels PX or a source/drain conductive layer which includes the first through m-th data lines D1 through Dm, but the present disclosure is not limited thereto.

The connecting signal wires SL may include at least one metal selected from the group consisting of copper (Cu), molybdenum (Mo), aluminum (Al), platinum (Pt), palladium (Pd), silver (Ag), magnesium (Mg), Au, Ni, neodymium (Nd), iridium (Jr), chromium (Cr), calcium (Ca), titanium (Ti), tantalum (Ta), and tungsten (W).

The lower substrate 100 may have a plurality of first through fourth sides 100s1 through 100s4. The panel pad area P_PA may be located on the first side 100s1 of the lower substrate 100. The upper substrate 200 may have a plurality of first through fourth sides 200s1 through 200s4. The first through fourth sides 200s1 through 200s4 of the upper substrate 200 may be aligned with the first through fourth sides 100s1 through 100s4 of the lower substrate 100 in the third direction D3. The panel pad area P_PA may be located on the first side 200s1 of the upper substrate 200.

In a case where the first through fourth sides 200s1 through 200s4 of the upper substrate 200 are aligned with the first through fourth sides 100s1 through 100s4 of the lower substrate 100 in the third direction D3, the sides of each of the signal lines SL may be exposed between the first through fourth sides 200s1 through 200s4 of the upper substrate 200 and the first through fourth sides 100s1 through 100s4 of the lower substrate 100 and the top surface of the each of the signal lines SL may not be exposed. Portions of the sides of each of the signal lines SL that are exposed are connected to the pad electrodes PDE and can thus increase the contact areas with lead wires LE of the FPCB 400. The pad electrodes PDE may be formed on the first through fourth sides 200s1 through 200s4 of the upper substrate 200 and on the first through fourth sides 100s1 through 100s4 of the lower substrate 100.

Conventionally, portions of the top surfaces of the signal lines SL on the lower substrate 100 may not be covered by the upper substrate 200. In this case, a desiccant may be formed on the signal lines SL to cover the exposed portions of the signal lines SL to prevent the signal lines SL from being affected by moisture. However, in the embodiment of FIG. 1, because the first through fourth sides 200s1 through 200s4 of the upper substrate 200 are aligned with the first through fourth sides 100s1 through 100s4 of the lower substrate 100 in the third direction D3 and the pad electrodes PDE are formed on the first through fourth sides 200s1 through 200s4 of the upper substrate 200 and on the first through fourth sides 100s1 through 100s4 of the lower substrate 100, a space for applying a desiccant may not be properly secured. Thus, the pad electrodes PDE may be susceptible to moisture.

The display panel DP may further include the sealant 250 by which the lower and upper substrates 100 and 200 are bonded together as illustrated in FIG. 6. The sealant 250 may be disposed along the edges of each of the lower and upper substrates 100 and 200. That is, the sealant 250 may be in the shape of a rectangular frame disposed along an edge area which is formed along the first through fourth sides 200s1 through 200s4 of the upper substrate 200 and along the first through fourth sides 100s1 through 100s4 of the lower substrate 100, but the present disclosure is not limited thereto.

The pad electrodes PDE may be electrically connected to portions of the sides of each of the connecting signal wires SL and may be connected to the lead wires LE of the FPCB 400 through the pad electrodes PDE. FIGS. 9 and 10 illustrate that there are provided fourteen pad electrodes PDE, but the number of pad electrodes PDE is not particularly limited.

The pad electrodes PDE may include at least one of Ag, Mo, Al, Pt, Pd, Mg, Au, Ni, Nd, Ir, Cr, Ca, Ti, Ta, W, or Cu. The pad electrodes PDE may be single-layer films, but the present disclosure is not limited thereto. Alternatively, the pad electrodes PDE may be multilayer films. For example, the pad electrodes PDE may be formed to have a stack of Ti/Al/Ti, Mo/Al/Mo, Mo/AlGe/Mo, or Ti/Cu.

The pad electrodes PDE may be disposed on and across the first sides 100s1 and 200s1 of the lower and upper substrates 100 and 200. The pad electrodes PDE may cover the first side 100s1 of the lower substrate 100 in the first direction D1. The pad electrodes PDE may also cover the first side 200s1 of the upper substrate 200, but may expose an upper end portion of the first side 200s1 of the upper substrate 200. However, the present disclosure is not limited to this. Alternatively, the pad electrodes PDE may cover the first side 100s1 of the lower substrate 100, but may expose a lower end portion of the first side 100s1 of the lower substrate 100.

The pad electrodes PDE may have a first thickness T1 in the third direction D3. The first thickness T1 may be affected by a second thickness T2 of the lower substrate 100 in the third direction D3 and a third direction T3 of the upper substrate 200 in the third direction D3. As the thickness of the display panel DP decreases, the second and third thicknesses T2 and T3 of the lower and upper substrates 100 and 200 may decrease, and the first thickness T1 of the pad electrodes PDE may also decrease. The absorption of external moisture may generally begin from the bottom of the lower substrate 100 and from the top of the upper substrate 200. That is, if the first thickness T1 of the pad electrodes PDE is reduced, the display device 1 may become susceptible to external moisture.

The FPCB 400 may include the conductive patterns 420, which are disposed on the base film 410. The conductive patterns 420 may include a plurality of lead wires LE. The lead wires LE may be disposed on one surface of the FPCB 400. The lead wires LE may be connected to the pad electrodes PDE of the display panel DP.

The lead wires LE may include a metallic material. The lead wires LE may include at least one metal selected from the group consisting of Mo, Al, Pt, Pd, Ag, Mg, Au, Ni, Nd, Ir, Cr, Ca, Ti, Ta, W, and Cu.

The FPCB 400 may further include an insulating layer 430 which covers the base film 410 and the conductive patterns 420. The insulating layer 430 may be solder resist which is an insulating material for protecting the conductive patterns 420 on the FPCB 400, and an opening OPN may be formed at a predetermined location in the insulating layer 430 to providing signals to the display device. For example, the opening OPN may be formed to overlap with the panel pad area P_PA and the ACF 310 in the first direction D1.

For a connection margin, the opening OPN of the insulating layer 430 may be formed to be wider than the areas where the pad electrodes PDE and the lead wires LE are connected. Accordingly, portions of the lead wires LE that are not covered by the insulating layer 430 may be susceptible to moisture.

As illustrated in FIG. 10, the connecting signal wires SL may include the first through n-th gate lines G1 through Gn, the first through m-th data lines D1 through Dm, the gate shift clock line GSCL, the gate-off voltage line VoffL, a ground voltage line GND, a gate IC driving voltage line VDD, the gate start signal line GSPL, the gate output enable signal line GOEL, the gate-on voltage line VonL, and the common voltage line VcomL. For convenience, a case where bump wires (BL1, BL2, and BL3) are not provided and a case where the bump wires (BL1, BL2, and BL3) are provided will hereinafter be described.

The gate shift clock line GSCL may have a voltage range of 0 V to 8.6 V, and the gate-off voltage line VoffL may have a voltage range of −9.4 V to −2 V. The ground voltage line GND may have a voltage of 0 V, and the gate IC driving voltage line VDD, the gate start signal line GSPL, and the gate output enable signal GOEL may have a voltage of 3.3 V. The gate-on voltage line VonL may have a voltage range of 15 V to 29 V, and the common voltage line VcomL may have a voltage of 6.3 V.

In a case where the display panel DP is subjected to a reliability test by exposing the display panel DP to a high-temperature, high-humidity environment for more than a predetermined amount of time, a screen may not be properly displayed on the display panel DP. In other words, if moisture and/or impurities penetrate the pad electrodes PDE and/or the lead wires LE, corrosion may occur.

Specifically, in a case where moisture and/or impurities penetrate the pad area P_PA, because the voltage difference between voltages applied to the gate shift clock line GSCL and the gate-off voltage line VoffL which are adjacent to each other is large galvanic corrosion, which is an electrochemical reaction in response to an electric field being applied to moisture or impurity ions via the pad electrode PDE connected to the gate shift clock line GSCL that has a higher voltage than the gate shift clock line GSCL, may occur between the gate shift clock line GSCL and the gate-off voltage line VoffL. As a result, the wirings may be corroded.

Because the voltage difference between voltages applied to the gate-off voltage line VoffL and the ground voltage line GND which are adjacent to each other is large too, galvanic corrosion may also occur between the gate-off voltage line VoffL and the ground voltage line GND. Because the voltage difference between voltages applied to the gate output enable signal line GOEL and the gate-on voltage line VonL which are adjacent to each other is large too, galvanic corrosion may also occur between the gate output enable signal line GOEL and the gate-on voltage line VonL.

Because the voltage difference between voltages applied to the ground voltage line GND, the gate IC driving voltage line VDD, the gate start signal line GSPL, and the gate output enable signal line GOEL which are adjacent to one another is not large, galvanic corrosion may not occur between the ground voltage line GND, the gate IC driving voltage line VDD, the gate start signal line GSPL, and the gate output enable signal line GOEL.

Even though the voltage difference between voltages applied to the gate-on voltage line VonL and the common voltage line VcomL is large, galvanic corrosion may not occur between the gate-on voltage line VonL and the common voltage line VcomL because the gate-on voltage line VonL and the common voltage line VcomL are sufficiently spaced apart from each other.

That is, the greater the difference between the voltages applied to each pair of adjacent lines, the higher the likelihood of galvanic corrosion, and the greater the distance between each pair of adjacent lines, the less the likelihood of galvanic corrosion. For example, if the voltage difference between each pair of adjacent pad electrodes PDE is about 7 V or greater, galvanic corrosion may become more likely to occur, and if each pair of adjacent wires are apart from each other by as much as the width of the pad electrodes PDE in the second direction D2, galvanic corrosion may become less likely to occur.

Referring to FIGS. 10 and 11, if the voltage difference between a pair of adjacent connecting signal lines SL is greater than a predetermined level, at least one bump wire BL may be disposed between the pair of adjacent connecting signal lines SL.

The bump wires (BL1, BL2, and BL3) may be electrodes to which no control voltages controlling the display panel is applied. For example, the first bump wires BL1 may not be supplied with the control voltages controlling the display panel The bump wires (BL1, BL2, and BL3) may have a predetermined voltage. If each of the bump wires (BL1, BL2, and BL3) having the predetermined voltage is disposed between a pair of adjacent connecting signal wires SL which have a voltage difference equal to or greater than a predetermined voltage difference, the voltage difference between the pair of adjacent connecting signal wires SL may be reduced. The bump wires (BL1, BL2, and BL3) can be provided with a predetermined voltage which can reduce a voltage difference between adjacent connecting wires SL by the driving circuit DIC via the lead wires LE.

Two first bump wires BL1_1 and BL1_2 may be disposed between the gate-off voltage line VoffL and the gate shift clock line GSCL which are adjacent to each other. Voltages applied to the plurality of bump wires increasing or decreasing sequentially between the voltages of the gate-off voltage line VoffL and the gate shift clock line GSCL. For example, if the gate-off voltage line VoffL has a voltage of −9.4 V and the gate shift clock line GSCL has a voltage of 7.6 V, the voltage difference between the two connecting signal lines SL is 17 V. If each pair of adjacent pad electrodes PDE has a voltage difference of about 7 V or greater, galvanic corrosion may become more likely to occur. Thus, the first bump wires BL1_1 and BL1_2 may be set to voltages of 2.6 V and −3 V, respectively, in order to maintain the voltage difference between adjacent pad electrodes PDE equal to or less than 7V.

One second bump wire BL2 may be disposed between the gate-off voltage line VoffL and the ground voltage line GND which are adjacent to each other. For example, if the gate-off voltage line VoffL has a voltage of −9.4 V and the ground voltage line GND has a voltage of 0 V, the voltage difference between the two connecting signal lines SL is 9.4 V. If each pair of adjacent pad electrodes PDE has a voltage difference of about 7 V or greater, galvanic corrosion may become more likely to occur. Thus, the second bump wire BL2 may be set to a voltage of −4.7 V in order to maintain the voltage difference between the pad electrodes PDE adjacent each other equal to or less than 7V.

Three third bump wires BL3_1, BL3_2, and BL3_3 may be disposed between the gate output enable signal line GOEL and the gate-on voltage line VonL, which are adjacent to each other. For example, if the gate output enable signal line GOEL has a voltage of 3.3 V and the gate-on voltage line VonL has a voltage of 29 V, the voltage difference between the two connecting signal lines SL is 25.7 V. If each pair of adjacent pad electrodes PDE has a voltage difference of about 7 V or greater, galvanic corrosion may become more likely to occur. Thus, the third bump wires BL3_1, BL3_2, and BL3_3 may be set to voltages of 10 V, 16.5 V, and 23 V, respectively, in order to maintain the voltage difference between pad electrodes PDE adjacent to each other equal to or less than 7V.

The voltages of the bump wires (BL1, BL2, and BL3) are not particularly limited, but may vary depending on the voltage difference between each pair of adjacent connecting signal wires SL. The number of bump wires may be determined to maintain a voltage difference between adjacent pad electrodes equal to or less than 7V.

Referring to FIG. 11, three third bump wires BL3_1, BL3_2, and BL3_3 may be disposed between the gate output enable signal line GOEL and the gate-on voltage line VonL. Among first through fifth distances D1' through D5' between the pad electrodes PDE, the first through fourth distances D1' through D4' may all be the same.

In order to reduce the risk of a burnt phenomenon between the pad electrodes PDE and the lead wires LE, when a high voltage is applied to the pad electrodes PDE, first through sixth widths W1' through W6' of the pad electrodes PDE may be greater than first through sixth widths W1 through W6 of first through sixth lead wires LE1 through LE6.

The first through sixth widths W1 through W6 of first through sixth lead wires LE1 through LE6 may all be the same, and the first through sixth lead wires LE1 through LE6 may be disposed in such a manner that the central lines of the first through sixth lead wires LE1 through LE6 coincide with the central lines of the pad electrodes PDE in the second direction D2. That is, among first through fifth distances D1 through D5 between the first through sixth lead wires LE1 through LE6, the first through fourth distances D1 through D4 may all be the same.

No bump wires may be disposed between the gate-on voltage line VonL and the common voltage line VcomL which are adjacent to each other. That is, if the pad electrodes PDE connected to the gate-on voltage line VonL and the common voltage line VcomL are sufficiently spaced apart from each other, i.e., if the fifth distance D5' is sufficiently large, galvanic corrosion may not occur between the two connecting signal wires SL.

Other embodiments of the present disclosure will hereinafter be described, focusing mainly on differences with the embodiment of FIG. 11.

Figure 12:
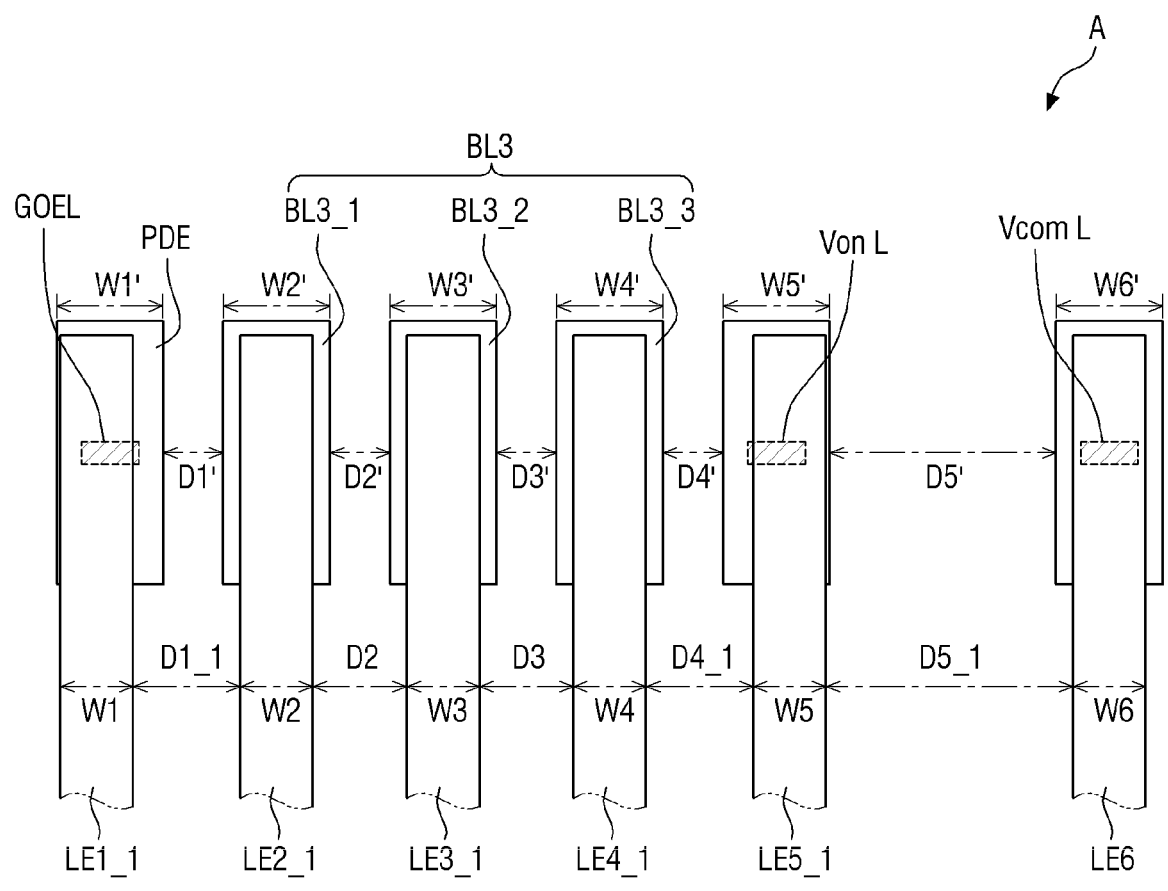
FIG. 12 illustrates the arrangement of connecting signal wires, pad electrodes, and lead wires according to another embodiment of the present disclosure.

FIG. 12 illustrates the arrangement of connecting signal wires, pad electrodes, and lead wires according to another embodiment of the present disclosure.

The embodiment of FIG. 12 differs from the embodiment of FIG. 11 in that the central line of a first lead wire LE1_1 which is connected to a gate output enable signal line GOEL is shifted, in a second direction D2, to the left of the central line of a pad electrode PDE connected to the gate output enable signal line GOEL, and that the central line of a fifth lead wire LE5_1 which is connected to a gate-on voltage line VonL is shifted, in the second direction D2, to the right of the central line of a pad electrode PDE connected to the gate-on voltage line VonL.

Specifically, referring to FIG. 12, a first width D1_1 between the first lead wire LE1_1 and a third bump wire BL3_1 and a fourth width D4_1 between the fifth lead wire LE5_1 and a third bump wire BL3_3 may be greater than the first width D1 and the fourth width D4 of FIG. 11, respectively. Accordingly, galvanic corrosion can be further prevented.

A fifth width D5_1 between the fifth lead wire LE5_1 which is connected to the gate-on voltage line VonL and a sixth lead wire LE6_1 which is connected to a common voltage line VcomL may be reduced, but because a fifth distance D5' between the pad electrode PDE connected to the gate-on voltage line VonL and a pad electrode PDE connected to the common voltage line VcomL is sufficiently large, galvanic corrosion may not occur between the two connecting signal wires SL.

Figure 13:
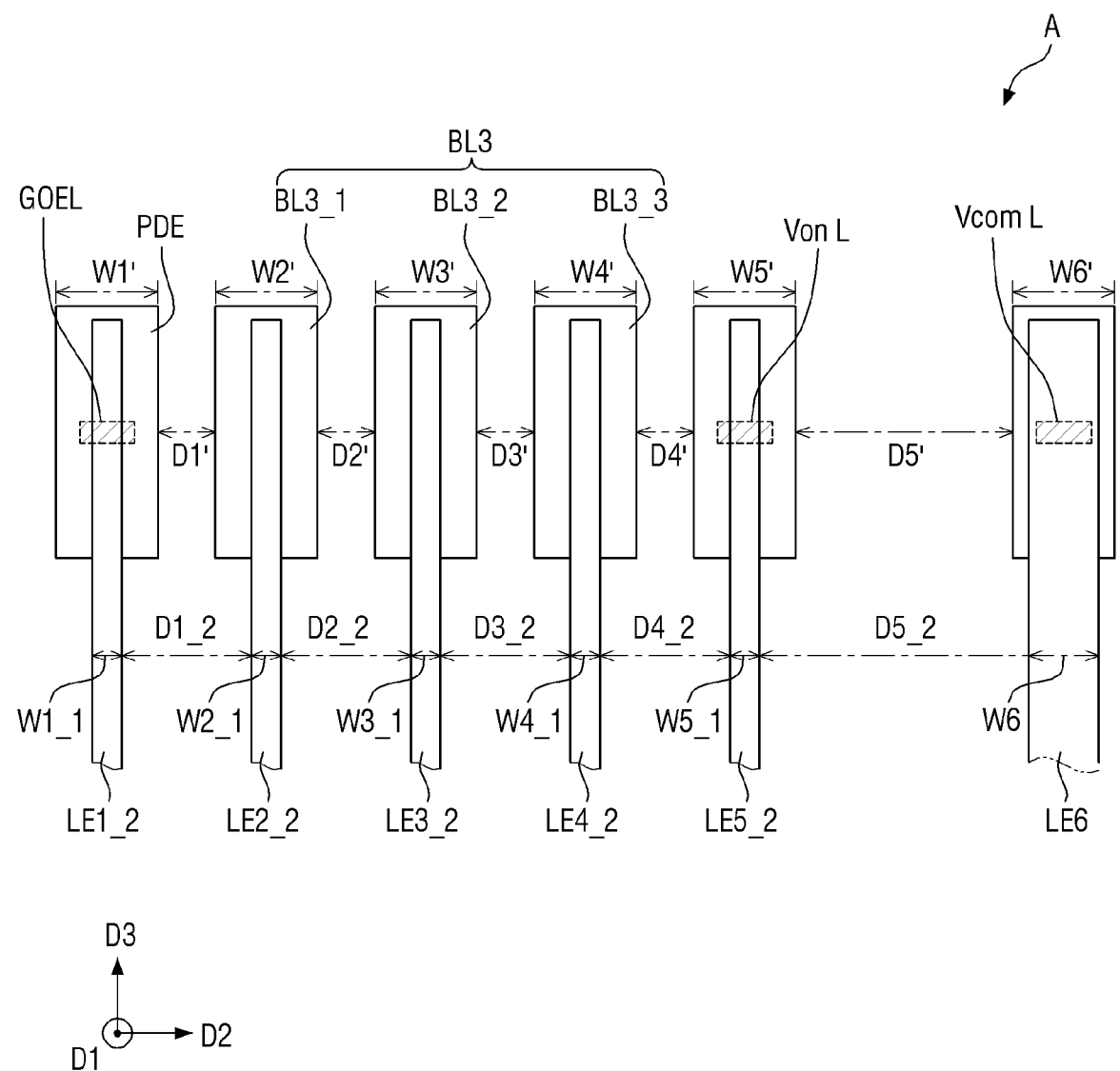
FIG. 13 illustrates the arrangement of connecting signal wires, pad electrodes, and lead wires according to another embodiment of the present disclosure.

FIG. 13 illustrates the arrangement of connecting signal wires, pad electrodes, and lead wires according to another embodiment of the present disclosure.

The embodiment of FIG. 13 differs from the embodiment of FIG. 11 in that first through fifth widths W1_1 through W5_1 of first through fifth lead wires LE1_2 through LE5_2 are smaller than the first through fifth widths W1 through W5 of the first through fifth lead wires LE1 through LE5 of FIG. 11.

Specifically, referring to FIG. 13, a first width D1_2 between a first lead wire LE1_2 which is connected to a gate output enable signal line GOEL and a second lead wire LE2_2, and a fourth width D4_2 between a fourth lead wire LE4_2 and a fifth lead wire LE5_2 which is connected to a gate-on voltage line VonL may be greater than the first width D1' and the fourth width D4', respectively. Accordingly, galvanic corrosion can be further prevented.

Figure 14:
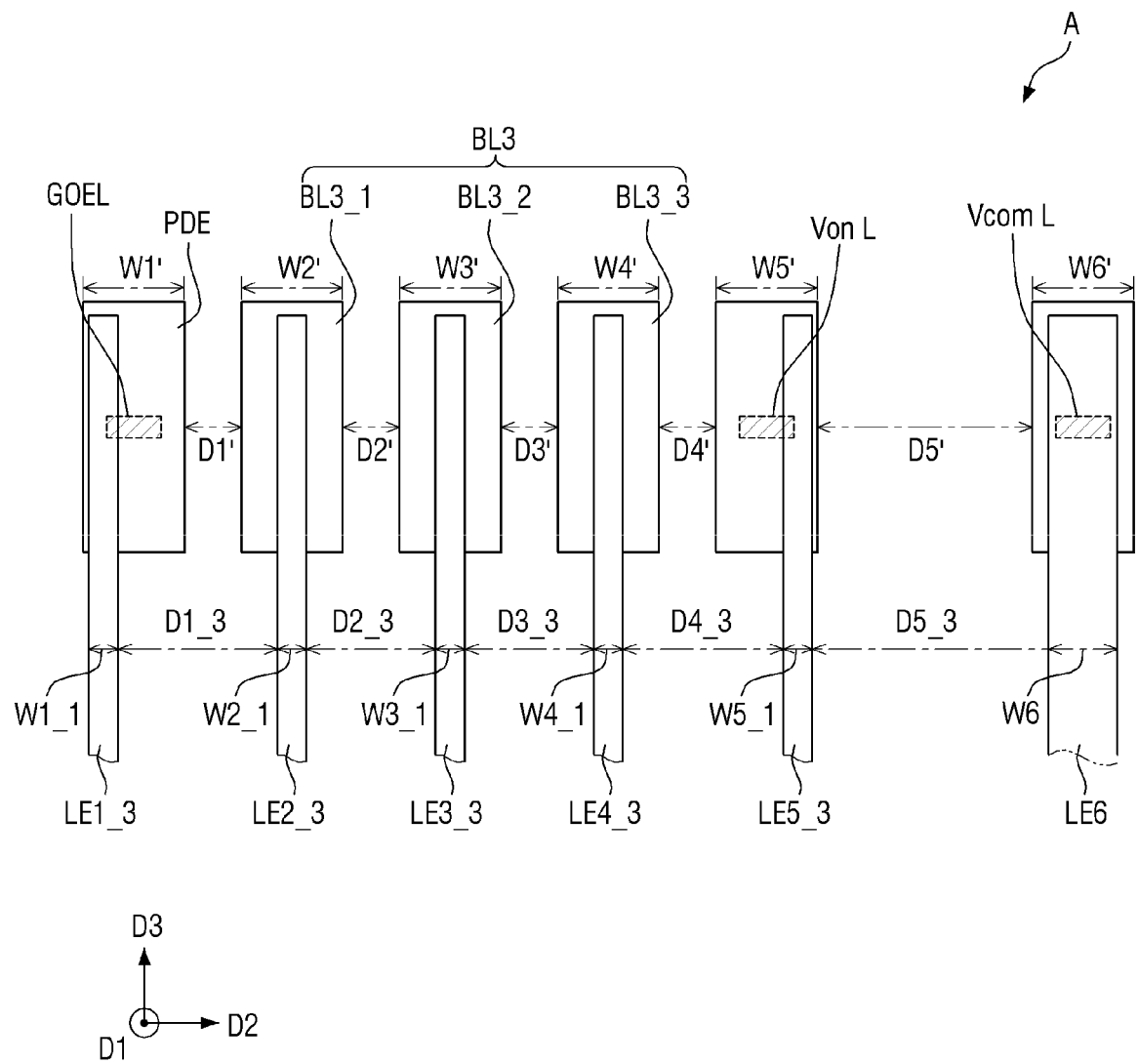
FIG. 14 illustrates the arrangement of connecting signal wires, pad electrodes, and lead wires according to another embodiment of the present disclosure.

FIG. 14 illustrates the arrangement of connecting signal wires, pad electrodes, and lead wires according to another embodiment of the present disclosure.

The embodiment of FIG. 14 differs from the embodiment of FIG. 13 in that the central line of a first lead wire LE1_3 which is connected to a gate output enable signal line GOEL is shifted, in a second direction D2, to the left of the central line of a pad electrode PDE connected to the gate output enable signal line GOEL, and that the central line of a fifth lead wire LE5_3 which is connected to a gate-on voltage line VonL is shifted, in the second direction D2, to the right of the central line of a pad electrode PDE connected to the gate-on voltage line VonL.

Specifically, referring to FIG. 14, a first width D1_3 between the first lead wire LE1_3 and a second lead wire LE2_3, and a fourth width D4_3 between the fifth lead wire LE5_3 and a fourth lead wire LE4_3 may be greater than the first width D1_2 and the fourth width D4_2 of FIG. 13, respectively. Accordingly, galvanic corrosion can be further prevented.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A display device comprising:
   a display panel including a plurality of connecting signal wires which supply different control voltages controlling the display panel and at least one bump wire which is disposed between adjacent connecting signal wires not to overlap any one of the plurality of connecting signal wires in a plan view, the at least one bump wire being not supplied with the different control voltages controlling the display panel, the display panel including a top surface through which an image is displayed, a bottom surface opposing the top surface and a side surface connecting the top surface and the bottom surface;

a flexible printed circuit board attached to the side surface of the display panel and including a base film and a plurality of lead wires which are disposed on the base film; and an anisotropic conductive film disposed between the plurality of connecting signal wires and the plurality of lead wires, wherein the plurality of connecting signal wires and the at least one bump wire are disposed on a same plane in the display panel.

2. The display device of claim 1, wherein the at least one bump wire is supplied with a voltage between voltages of the adjacent connecting signal wires.

3. The display device of claim 1, wherein the flexible printed circuit board includes a driving circuit which includes a gate driver, a data driver, a timing controller, and a power management integrated circuit.

4. The display device of claim 3, wherein the bump wires receive a predetermined voltage from the driving circuit via the plurality of lead wires.

5. The display device of claim 1, wherein the anisotropic conductive film includes a resin film and a plurality of conductive balls which are disposed in the resin film and are arranged in a matrix in a layer.

6. The display device of claim 1, wherein the plurality of connecting signal wires have ends thereof exposed on the side surface of the display panel and are connected to a plurality of pad electrodes.

7. The display device of claim 6, wherein
the plurality of pad electrodes are formed of silver, and
the plurality of connecting signal wires and the plurality of lead wires are formed of copper.

8. The display device of claim 6, wherein the plurality of pad electrodes are spaced apart from one another in a direction in which the side surface of the display panel extends.

9. The display device of claim 8, wherein a width of a lead wire connected to a pad electrode not adjacent to the bump wires is the same as a width of a lead wire connected to a pad electrode adjacent to the bump wires.

10. The display device of claim 9, wherein a width of the plurality of pad electrodes is greater than a width of the plurality of lead wires.

11. The display device of claim 9, wherein central axes of the plurality of lead wires coincide with central axes of the plurality of pad electrodes.

12. The display device of claim 9, wherein
a central axis of a lead wire connected to the pad electrode adjacent to the bump wires is shifted in one direction from a central axis of the pad electrode adjacent to the bump wires, and
a central axis of another lead wire connected to the pad electrode adjacent to the bump wires is shifted in the other direction from the central axis of the pad electrode adjacent to the bump wires.

13. The display device of claim 8, wherein, in the direction in which the side surface of the display panel extends, a width of a lead wire connected to a pad electrode not adjacent to the hump wires is different from a width of a lead wire connected to a pad electrode adjacent to the hump wires.

14. The display device of claim 13, wherein the width of the lead wire connected to the pad electrode adjacent to the bump wires is less than the width of the lead wire connected to the pad electrode not adjacent to the bump wires.

15. The display device of claim 13, wherein central axes of the plurality of lead wires coincide with central axes of the plurality of pad electrodes.

16. The display device of claim 13, wherein
a central axis of the lead wire connected to the pad electrode adjacent to the bump wires is shifted in one direction from a central axis of the pad electrode adjacent to the bump wires, and
a central axis of another lead wire connected to the pad electrode adjacent to the bump wires is shifted in the other direction from the central axis of the pad electrode adjacent to the hump wires.

17. The display device of claim 1, wherein the plurality of connecting signal wires are connected to a plurality of connecting signal wire pad electrodes, respectively, and the at least one bump wire is connected to a bump wire pad electrode, and
wherein the plurality of connecting signal wire pad electrodes and the bump wire pad electrode are disposed on a same plane and a same layer on the side surface.

18. The display device of claim 17, wherein the plurality of connecting signal wire pad electrodes are directly connected to the plurality of connecting signal wires, respectively.

19. A display device comprising:
a display panel including a plurality of connecting signal wires which supply different control voltages controlling the display panel and at least one bump wire which is disposed between adjacent connecting signal wires not to overlap the adjacent connecting signal wires in a plan view, the at least one hump wire being not supplied with the different control voltages controlling the display panel, the display panel including a top surface through which an image is displayed, a bottom surface opposing the top surface and a side surface connecting the top surface and the bottom surface;
a flexible printed circuit board attached to the side surface of the display panel and including a base film and a plurality of lead wires which are disposed on the base film; and
an anisotropic conductive film disposed between the plurality of connecting signal wires and the plurality of lead wires,
wherein the at least one bump wire is supplied with a voltage between voltages of the adjacent connecting signal wires, wherein a plurality of bump wires are disposed between the adjacent connecting signal wires, voltages applied to the plurality of bump wires increasing or decreasing sequentially between the voltages of the adjacent connecting signal wires.

20. A display device comprising:
a display panel including a plurality of connecting signal wires which supply different control voltages controlling the display panel and at least one bump wire which is disposed between adjacent connecting signal wires not to overlap the adjacent connecting signal wires in a plan view, the at least one bump wire being not supplied with the different control voltages controlling the display panel, the display panel including a top surface through which an image is displayed, a bottom surface opposing the top surface and a side surface connecting the top surface and the bottom surface;
a flexible printed circuit board attached to the side surface of the display panel and including a base film and a plurality of lead wires which are disposed on the base film; and an anisotropic conductive film disposed between the plurality of connecting signal wires and the plurality of lead wires, wherein a number of bump wires is determined by a value obtained by dividing a voltage difference between the adjacent connecting signal wires by a first value.

* * * * *